US008835283B2

(12) United States Patent
Hua

(10) Patent No.: US 8,835,283 B2
(45) Date of Patent: Sep. 16, 2014

(54) FABRICATION METHOD FOR PRODUCING SEMICONDUCTOR CHIPS WITH ENHANCED DIE STRENGTH

(71) Applicant: WIN Semiconductors Corp., Tao Yuan Shien (TW)

(72) Inventor: Chang-Hwang Hua, Tao Yuan Shien (TW)

(73) Assignee: WIN Semiconductors Corp., Tao Yuan Shien (TW)

( * ) Notice: Subject to any disclaimer, the term of this patent is extended or adjusted under 35 U.S.C. 154(b) by 0 days.

(21) Appl. No.: 13/971,525

(22) Filed: Aug. 20, 2013

(65) Prior Publication Data
US 2013/0337634 A1 Dec. 19, 2013

Related U.S. Application Data

(63) Continuation-in-part of application No. 13/357,338, filed on Jan. 24, 2012, now abandoned.

(30) Foreign Application Priority Data

Oct. 21, 2011 (TW) ............................... 100138248 A

(51) Int. Cl.
H01L 21/78 (2006.01)
H01L 29/06 (2006.01)
(52) U.S. Cl.
CPC ............ H01L 21/78 (2013.01); H01L 29/0657 (2013.01)
USPC ............... 438/465; 257/620; 438/33; 438/68; 438/113; 438/114; 438/458; 438/460; 438/461; 438/462; 438/463; 438/464

(58) Field of Classification Search
USPC .............. 257/620; 438/33, 68, 113, 114, 458, 438/460–465, FOR. 386
See application file for complete search history.

(56) References Cited

U.S. PATENT DOCUMENTS

| | | | |
|---|---|---|---|
| 2004/0108297 A1* | 6/2004 | Erk et al. ........................... | 216/2 |
| 2005/0040384 A1 | 2/2005 | Tanaka et al. | |
| 2006/0193359 A1 | 8/2006 | Kuramoto | |
| 2008/0265265 A1* | 10/2008 | Xiong et al. ..................... | 257/97 |
| 2010/0120228 A1* | 5/2010 | Saito et al. ..................... | 438/463 |
| 2010/0140630 A1* | 6/2010 | Hamaguchi et al. ............ | 257/79 |
| 2013/0234111 A1* | 9/2013 | Pfister et al. ..................... | 257/14 |

* cited by examiner

Primary Examiner — David Vu
Assistant Examiner — Jonathan Han
(74) Attorney, Agent, or Firm — Muncy, Geissler, Olds & Lowe, P.C.

(57) ABSTRACT

A fabrication method for producing semiconductor chips with enhanced die strength comprises following steps: forming a semiconductor wafer with enhanced die strength by comprising the substrate, the active layer on the front side of the substrate and the backside metal layer on the backside of the substrate, wherein at least one integrated circuit forms in the active layer; forming a protection layer on a front side of the semiconductor wafer; dicing the semiconductor wafer by at least one laser dicing process and removing the laser dicing residues and removing said protection layer by at least one etching process, whereby plural semiconductor chips with enhanced die strength are produced, and wherein the backside metal layer of said semiconductor chip fully covers the backside of said semiconductor chip after dicing.

18 Claims, 8 Drawing Sheets

FABRICATION METHOD FOR PRODUCING SEMICONDUCTOR CHIPS WITH ENHANCED DIE STRENGTH

CROSS-REFERENCE TO RELATED DOCUMENTS

The present invention is a continuation in part (OP) to a U.S. patent application Ser. No. 13/357,338 entitled "Structure of semiconductor chips with enhanced die strength and a fabrication method thereof" and filed on Jan. 24, 2012.

FIELD OF THE INVENTION

The present invention relates to a fabrication method for producing semiconductor chips with enhanced die strength, in particular to a fabrication method for producing semiconductor chips with enhanced die strength thereof without beforehand back-etching of masking streets of the substrate, the substrate thereof is first thinned to have a thickness less than 100 μm, and then a backside metal layer is deposited to the backside of the substrate. By using the laser dicing process of the present invention, the semiconductor chips can be diced tidily. The fabrication tool capacity can be increased; the process cycle time can be reduced to nearly half; the usage of material can be reduced, the efficiency of heat dissipation of the diced single chip can be increased; and the die strength can be significantly enhanced.

BACKGROUND OF THE INVENTION

FIG. 1A is a schematic view showing the front view side of the substrate of integrated circuit chips, which comprises a substrate 101, and above the substrate 101 an active layer 103 is disposed and includes at least one integrated circuit. Each black block corresponds to an independent integrated circuit.

After the fabrication of integrated circuits, the substrate 101 has to be diced into independent single chips, so that each single chip contains an independent integrated circuit. A backside metal layer has to be deposited to the backside of the substrate 101 beforehand to provide improved adhesion strength and die strength for chip packaging thereafter.

However, when a backside metal layer is directly deposited to the backside of the substrate 101, the fragments from the backside metal layer on the backside of the substrate 104 will be sprayed all around or adhered to the sidewall of scribe lines through the sawing wheel in the dicing process according to the conventional substrate dicing technique. Moreover, the metal fragments may adhere to the integrated circuits in the active layer 103, which will damage the function of integrated circuits in the active layer 103.

FIG. 1B is a cross-sectional view showing the structure of an adhesive seed layer, a backside metal layer, and a photoresist layer formed on the backside of a substrate in a previous technology. After the fabrication of integrated circuits, the backside of the substrate 101 will be thinned first till the thickness of the substrate 101 is about 100 μm. Then, on the backside of the substrate 101, an adhesive seed layer 105, a backside metal layer 107, and a photoresist layer 109 are formed sequentially.

FIG. 1C is a cross-sectional view showing the structure of streets formed by etching the photoresist layer on the backside of the substrate in a previous technology. The streets 111 on the photoresist layer are formed by etching the photoresist layer 109.

FIG. 1D is a, cross-sectional view showing the structure of streets formed by etching the backside metal layer on the backside of the substrate in a previous technology. The streets 113 on the backside metal layer are formed by etching the backside metal layer 107 and the adhesive seed layer 105.

FIG. 1E is a cross-sectional view showing the structure after removing the photoresist layer at the backside of the substrate in a previous technology.

FIG. 1F is a cross-sectional view showing the structure of a substrate diced by the dicing process of a previous technology. The substrate 101 is diced along the center of the backside metal layer streets 113 to form scribe lines 115. The width of scribe lines 115 is narrower than the width of the backside metal layer streets 113 and thus it can prevent damages on the backside metal layer 107 and the adhesive seed layer 105.

Independent single chips are produced after dicing, as shown by the schematic of a cross-sectional view of the structure of a single chip after substrate dicing in a previous technology in FIG. 1G. However, because the width of scribe lines 115 is narrower than the width of streets 113 on the backside metal layer, part of the backside metal layer streets 113 will not be cut off and will be remained there as the edge recess 117. There are borders between the substrate 101 and the adhesive seed layer 105 and between the adhesive seed layer 105 and the backside metal layer 107 at the edge recess 117. By etching the backside metal layer streets 113, the borders between the substrate 101 and the adhesive seed layer 105 and between the adhesive seed layer 105 and the backside metal layer 107 is not able to form tidy interface, and therefore cracks and chipping may occur at the die edge. Thereby, the die strength is often insufficient, which leads to high probability of the occurrence of die-crack.

FIG. 1H is a schematic view showing a process of laser scribing in a previous technology, which comprises a semiconductor wafer 133, a laser device 121 and an optical lens 135. The semiconductor wafer 133 comprises a device layer 147, a substrate 149 and a metal layer 151. The metal layer 151 contains a metal mirror sub-layer 153 and a gold sub-layer 155. A contact 143 is configured on device layer 147. And a contact wire 145 is deposited on contact 143. The substrate 149 is made of silicon carbide (SiC) or sapphire ($Al_2O_3$). When the laser beam 123 is generated by laser device 121, the laser beam 123 is focused and redirected by the optical lens 135. The laser beam 137 is transparent to the material of substrate 149, hence the laser beam 137 may be capable of passing through the transparent materials of substrate 149 with minimum loss of photons. The laser beam 1.37 passes through areas 161 next to street 127 and reaches the focal point 157 of the laser beam 137. The focal point 157 of the laser beam 137 is at location 125, which is located inside the substrate 149 closer to the backside 131 of the semiconductor wafer 133. When the laser beam 137 reaches the focal point 157, the high intensity laser beam 137 can scribe and weaken the crystal lattice at point 157. After laser scribe, a scribing line 159 is used to induce a breakage along a crystal line parallel to a street for dicing dies from a wafer. After laser scribing, the semiconductor wafer 133 can easily be bended or broken into chips along the scribing line 159. However, during bending or breaking process, the metal layer 151 may be cracked. Hence, the metal layer 151 may not fully cover the backside of the substrate 149. And this may result poor die strength. The previous technology didn't disclose a process how to cut the metal layer.

In view of these facts and for overcoming the drawback stated above, the present invention provides a structure of semiconductor chips with enhanced die strength and a fabrication method thereof. The improved structure and the fabrication method according to the present invention not only have enhanced die strength, but also have improved heat conductance. The usage of material can be reduced, and the fabrication tool capacity can be increased, so that the fabrication cost can be significantly reduced.

SUMMARY OF THE INVENTION

The main object of the present invention is to provide a fabrication method for producing semiconductor chips with enhanced die strength, in which a backside metal layer is deposited directly to fully cover the backside of a substrate. By applying the laser dicing process of the present invention, the backside metal layer and the substrate can be diced tidily. Die cracking on the border between the substrate and the backside metal layer of the semiconductor chips after dicing can be prevented and thereby the die strength can be significantly enhanced. By applying the laser dicing process of the present invention, the fragments from the backside metal layer will not be sprayed all around, and there will be no metal fragment adhesion to the integrated circuits on the chips, and therefore the performance of the integrated circuits in the active layer will not be affected, and the product yield rate can be increased. And by applying the laser dicing process of the present invention, the wasted width in the dicing process is about 30 μm, which is much less than the wasted width 60 μm of the masking streets in the previous technology. Therefore, the density of integrated circuits implemented in the active layer can be increased; the substrate utilization and the density of chips can be increased; the usage of material can be decreased, and the material cost can be reduced.

Another object of the present invention is to provide a fabrication method for producing semiconductor chips with enhanced die strength, in which a backside metal layer is deposited directly to fully cover the backside of a substrate. The street masking step in the previous technology can be eliminated. Thereby the fabrication tool capacity can be increased, and the process cycle time can be reduced to nearly half. The fabrication cost can therefore be significantly reduced.

Another object of the present invention is to provide a fabrication method for producing semiconductor chips with enhanced die strength, in which, before depositing a backside metal layer to the backside of a substrate, the backside of the substrate can be thinned first. The substrate can be thinned to have a thickness less than 50 μm. Consequently, when drilling, dry etching, or any further processing is applied to the substrate, the process cycle time can be significantly reduced. The processing tool capacity can be increased and the depletion of the processing tools can be decreased. The fabrication cost can therefore be significantly reduced. Because the thickness of the substrate is thinned very thin, the efficiency of heat dissipation of a diced semiconductor chip in an application can be increased, which can prevent damages to the integrated circuits on the chip and maintain the performance of the integrated circuits on the chip. And the material thinned from the substrate can be recycled and then purified to make the substrate again, which can further reduce the fabrication cost.

Another object of the present invention is to provide a fabrication method for producing semiconductor chips with enhanced die strength, in which a backside metal layer is deposited directly to fully cover the backside of a substrate. By applying the laser dicing process of the present invention, the die strength of the semiconductor chips can be significantly enhanced. Because of the enhancement of the die strength, the thickness of the deposited backside metal layer can be thinner. A thickness of 3 μm of the backside metal layer is enough to provide the requested die strength. Thereby the amount of metal needed can be decreased, and the fabrication cost can therefore be significantly reduced.

To reach the objects stated above, the present invention provides a fabrication method for producing semiconductor chips with enhanced die strength, comprising following steps:

Step A1: forming an active layer on a front side of a substrate, in which the active layer comprises at least one integrated circuit;

Step A2: forming a backside metal layer on a backside of the substrate, in which the backside metal layer at least fully covers the area corresponding to the area covered by the at least one integrated circuit in the active layer, so as to form at least one semiconductor wafer with enhanced die strength by comprising the substrate, the active layer and the backside metal layer;

Step A3: forming a protection layer on a front side of the semiconductor wafer, in which the protection layer fully covers the at least one integrated circuit in the active layer;

Step A4: dicing the semiconductor wafer with enhanced die strength from the front side of the semiconductor wafer to a backside of the semiconductor wafer by at least one laser dicing process, whereby plural semiconductor chips with enhanced die strength are produced, and wherein the backside metal layer of the semiconductor chip fully covers the backside of the semiconductor chip after dicing; and Step A5: removing the laser dicing residues and removing said protection layer by at least one etching process, wherein said laser dicing residues are generated during said at least one laser dicing process In an embodiment, in Step A4 the power of the laser used in the at least one laser dicing process is larger than 2.7 W and smaller than 4.8 W.

In an embodiment, in Step A4 the area of the backside metal layer of the semiconductor chip is larger than or equal to the backside area of the substrate of the semiconductor chip.

In an embodiment, the fabrication method for producing semiconductor chips with enhanced die strength according to the present invention further comprises an A15 step between the Step A1 and the Step A2:

Step A15: grinding the backside of the substrate, so as to thin the substrate.

In an embodiment, in Step A1 the thickness of the substrate is larger than 10 μm and smaller than 200 μm.

In an embodiment, in Step A1 the material used for the substrate is GaAs, InP or Si.

In an embodiment, in Step A3 the protection layer is a photoresist.

In an embodiment, in Step A3 the thickness of the protection layer is larger than 0.5 μm and smaller than 20 μm.

In an embodiment, in Step in A5 the at least one etching process includes following two etching processes:

The first etching process: removing the laser dicing residues; and

The second etching process: removing the protection layer.

In an embodiment, in the first etching process uses a water solution of sulfuric acid ($H_2SO_4$) and hydrogen peroxide ($H_2O_2$).

In an embodiment, in the second etching process uses a water solution containing potassium borate and potassium hydroxide.

In an embodiment, in Step A2 the material used for the backside metal layer is metal or alloy.

In an embodiment, the metal is gold or copper.

In an embodiment in Step A2 the backside metal layer is deposited to the backside of the substrate by evaporation, electroplating, sputtering or molecular beam epitaxy (MBE).

In an embodiment, in Step A2 the backside metal layer fully covers the backside of the substrate.

In an embodiment, in Step A4 the at least one laser dicing process includes following two laser dicing processes:

The First laser dicing process: dicing the semiconductor wafer with enhanced die strength by using a laser from the front side of the semiconductor wafer to the sufficient depth of the substrate close to the backside metal layer, so as to accelerate the dicing of the substrate; and The Second laser dicing process: dicing the semiconductor wafer with enhanced die strength by using a laser from the sufficient depth of the substrate close to the backside metal layer to the backside of the semiconductor wafer, so as to reduce melting fragment of the backside metal layer.

In an embodiment, the power of the laser used in the first laser dicing process is larger than 2.7 W and smaller than 4.8 W; the power of the laser used in the second laser dicing process is larger than 3.5 W and smaller than 4.3 W.

In an embodiment, the sufficient depth of the substrate close to the backside metal layer is thicker than 50% of the substrate thickness and thinner than 95% of the substrate thickness.

For further understanding the characteristics and effects of the present invention, some preferred embodiments referred to drawings are in detail described as follows.

DETAILED DESCRIPTIONS OF PREFERRED EMBODIMENTS

FIG. 2A is a cross-sectional view showing the structure of the substrate of integrated circuit chips of the present invention before back thinning, which comprises a substrate 201; an active layer 203 disposed above the substrate 201. The substrate 201 is formed preferably of GaAs, InP or Si. The active layer 203 includes at least one integrated circuit. In an embodiment, the active layer 203 usually includes plural independent integrated circuits, which will be cut into plural independent semiconductor chips and then packaged to make product.

A backside metal layer has to be deposited to the backside of the substrate 201 before dicing, which can enhance the die strength on one hand, and facilitate the adhesion in packaging on the other hand. In an embodiment, before depositing a backside metal layer to the backside of the substrate 201, the backside of the substrate 201 will be thinned first. The thickness of the substrate 201 is preferably larger than 10 µm and smaller than 200 µm after thinning.

In an embodiment, the substrate 201 is thinned to have the thickness of about 50 µm to 100 µm. FIG. 2B shows the cross-sectional view of the substrate of integrated circuit chips of the present invention after back thinning. It is shown in FIG. 2B that the substrate 201 becomes thinner after back thinning. The thinned backside of the substrate 201 provides a region 207 for the backside metal layer deposition.

Next, as shown in FIG. 2C, which is a cross-sectional view of the substrate with the deposited backside metal layer of the present invention, a backside metal layer 209 is deposited to the region 207 for the backside metal layer deposition. An adhesive seed layer (not shown in the figures) may grown on the region 207 for the adhesion of the backside metal layer 209 before depositing the backside metal layer 209 to the region 207. The semiconductor wafer 231 with enhanced die strength comprises the substrate 201, the active layer 203 and the backside metal layer 209.

The backside metal layer 209 is formed preferably of metal or alloy, and the metal is preferably gold or copper. The backside metal layer 209 is deposited to the region 207 on the backside of the substrate 201 preferably by evaporation, electroplating, sputtering or MBE.

The thickness of the backside metal layer 209 is larger than 0.1 µm and smaller than 50 µm. In an embodiment, the thickness of the backside metal layer 209 is preferably around 3 µm. The backside metal layer 209 should be able to cover at least the backside area of the substrate 201 corresponding to the area covered by the integrated circuits in the active layer 203. Moreover, the backside metal layer 209 can be larger than or equal to the area covered by the integrated circuits in the active layer 203. In an embodiment, the region 207 on the backside of the substrate 201 can be completely covered by the deposited backside metal layer 209, which makes the fabrication process more simplified.

As shown in FIG. 2D, which is a cross-sectional view of the semiconductor wafer with the deposited protection layer of the present invention, a protection layer 221 is formed on a front side of the semiconductor wafer 231, in which the protection layer 221 fully covers every integrated circuit in the active layer 203. The protection layer 221 can be a thin film of photoresist or other suitable materials. The photoresist is covered on the active layer 203 by spin coating and then dried by heating. In an embodiment, the baking temperature is usually about 60 degree in C. and the baking time is about 60 minutes. The thickness of the protection layer 221 is larger than 0.5 µm and smaller than 20 µm. In an embodiment, the typical thickness of protection layer 221 is about 1.5 µm.

As shown in FIG. 2E, which is a cross-sectional view of the laser dicing the semiconductor wafer of the present invention, cutting the semiconductor wafer 231 with enhanced die strength is performed by using the laser dicing method disclosed by the present invention. The laser dicing method includes two laser dicing processes, the first one laser dicing process and the second laser dicing process.

As shown in FIG. 2F, which is a cross-sectional view of the first laser dicing process of the present invention, in the first laser dicing process, a laser device 223 is deposited above the semiconductor wafer 231 with enhanced die strength. After aligning, the laser dicing the protection layer 221 and the semiconductor wafer 231 from the front side of the semiconductor wafer 231 to the sufficient depth 233 of the substrate 201 close to the backside metal layer 209, so as to accelerate the dicing of the substrate 201.

The needed laser power for dicing the protection layer 221 and the semiconductor wafer 231 is related to the material of the substrate 201 and the thickness of the substrate 201. And the sufficient depth 233 of the substrate 201 close to the backside metal layer 209 is also dependent on the thickness of the substrate 201 and the material of the substrate 201. If the substrate 201 is thicker, the laser needs higher power for dicing. And if the material of the substrate 201 is harder, the laser needs higher power for dicing. If the substrate 201 is thicker, the sufficient depth 233 of the substrate 201 close to the backside metal layer 209 is deeper.

To choose the suitable power of laser for dicing the semiconductor wafer 231 to the sufficient depth 233 of the substrate 201 close to the backside metal layer 209 needs to do experimental testing. The experience of the experimental testing will conclude an optimal solution. In most of the cases, the power of the laser used in the first laser dicing process is larger than 4.2 W and smaller than 4.8 W. And the sufficient depth 233 of the substrate 201 close to the backside metal layer 209 is thicker than 80% of the substrate 201 thickness and thinner than 90% of the substrate 201 thickness. In some special cases, the minimum laser power needed for dicing is 2.7 W. Hence, in an embodiment, for the GaAs substrate 201, the power of the laser used in the first laser dicing process is larger than 2.7 W and smaller than 4.8 W. And in an embodiment, the sufficient depth 233 of the substrate 201 close to the backside metal layer 209 is thicker than 50% of the substrate 201 thickness and thinner than 95% of the substrate 201 thickness.

As shown in FIG. 2G, which is a cross-sectional view of the second laser dicing process of the present invention, following the first laser dicing process is the second laser dicing process. The laser dicing the semiconductor wafer 231 with enhanced die strength from the sufficient depth 233 of the substrate 201 close to the backside metal layer 209 to the backside of the semiconductor wafer 231, so as to reduce melting fragment of the backside metal layer 209. The needed laser power for dicing the semiconductor wafer 231 is mostly dependent of the material of the backside metal layer 209 and the thickness of the backside metal layer 209. In an embodiment, the power of the laser used in the second laser dicing process is larger than 3.5 W and smaller than 4.3 W.

For some special cases, especially when the substrate 201 is thinner than 50 µm, it is more efficient to dice the semiconductor wafer 231 by only one laser dicing process. As shown in FIG. 2H, a schematic showing the cross-sectional view of one laser dicing process of the present invention, the laser directly dices the protection layer 221 and the semiconductor wafer 231 from the front side of the semiconductor wafer 231 to the backside of the semiconductor wafer 231. It is an example of cutting the semiconductor wafer 231 with the thickness of the substrate 201 is larger than 10 µm and smaller than 50 µm. In an embodiment, the power of the laser used in the laser dicing process is larger than 3.5 W and smaller than 4.3 W.

The width of each scribe lines 211 is 30 µm. After dicing, each of the scribe lines 211 will waste about the width of 30 µm of the substrate 201 and the backside metal layer 209. By using the laser dicing process of the present invention, the fragments from the backside metal layer 209 will not be sprayed all around, and there will be no metal fragment adhered to the integrated circuits in the active layer 203, and therefore the performance of the integrated circuits in the active layer 203 will not be affected, and the product yield rate can be improved.

As shown in FIG. 2I, it is a cross-sectional view showing the semiconductor chips after laser dicing process of the present invention. During the laser dicing process, there will generate some laser dicing residues. The laser dicing residues needs to be removed. And also the protection layer 221 needs to be removed too. It is possible to remove the laser dicing residues and the protection layer 221 by an etching process. The etching process usually is a wet etching process. However it is more perfect to remove the laser dicing residues and remove the protection layer 221 separately by two separate etching processes. In the first etching process, a first water solution is used to remove the laser dicing residues. In the second etching process, a second water solution is used to remove the protection layer 221. In an embodiment, the first water solution is a water solution of sulfuric acid ($H_2SO_4$) and hydrogen peroxide ($H_2O_2$). In another embodiment, the second water solution is a water solution containing potassium borate and potassium hydroxide.

As shown in FIG. 2J, is a cross-sectional view showing the structure of a semiconductor chip with enhanced die strength of the present dicing technique. After etching process, plural semiconductor chips 235 with enhanced die strength are produced, and wherein the backside metal layer 209 of the semiconductor chip 235 fully covers the backside of the semiconductor chip 235. The semiconductor chip 235 comprises: a substrate 201; an active layer 203 formed above the substrate 201, which includes at least one integrated circuit; a backside metal layer 209 is deposited to the backside of the substrate 201, which fully covers the backside of the substrate 201, and the area of the backside metal layer 209 is larger than or equal to the area of the substrate 201. After dicing, the border between the substrate 201 and the backside metal layer 209 near the edge of the semiconductor chip 235 is the border 215. By applying the laser dicing process of the present invention, the backside metal layer 209 and the substrate 201 can be cut tidily, and the composition at the border 215 remains intact, and therefore die cracking on the border 215 between the substrate 201 and the backside metal layer 209 can be prevented. Thereby, the die strength of the semiconductor chips 235 can be largely enhanced.

To sum up, by applying the laser dicing process of the present invention, the semiconductor chips can be diced tidily without back etching of masking street beforehand, and the substrate can be thinned to have the thickness thinner than 100 µm. It can increase the fabrication tool capacity. The process cycle time can be reduced to nearly half, and the usage of materials can be reduced. The heat dissipation efficiency of the diced single chip can be improved, and the die strength will be largely enhanced. The present invention indeed can get its anticipatory object, and provide improved fabrication process stability and device reliability.

The description referred to the drawings stated above is only for the Preferred embodiments of the present invention. Many equivalent local variations and modifications can still be made by those skilled at the field related with the present invention and do not depart from the spirits of the present invention, so they should be regarded to fall into the scope defined by the appended claims.

Figure 1A:
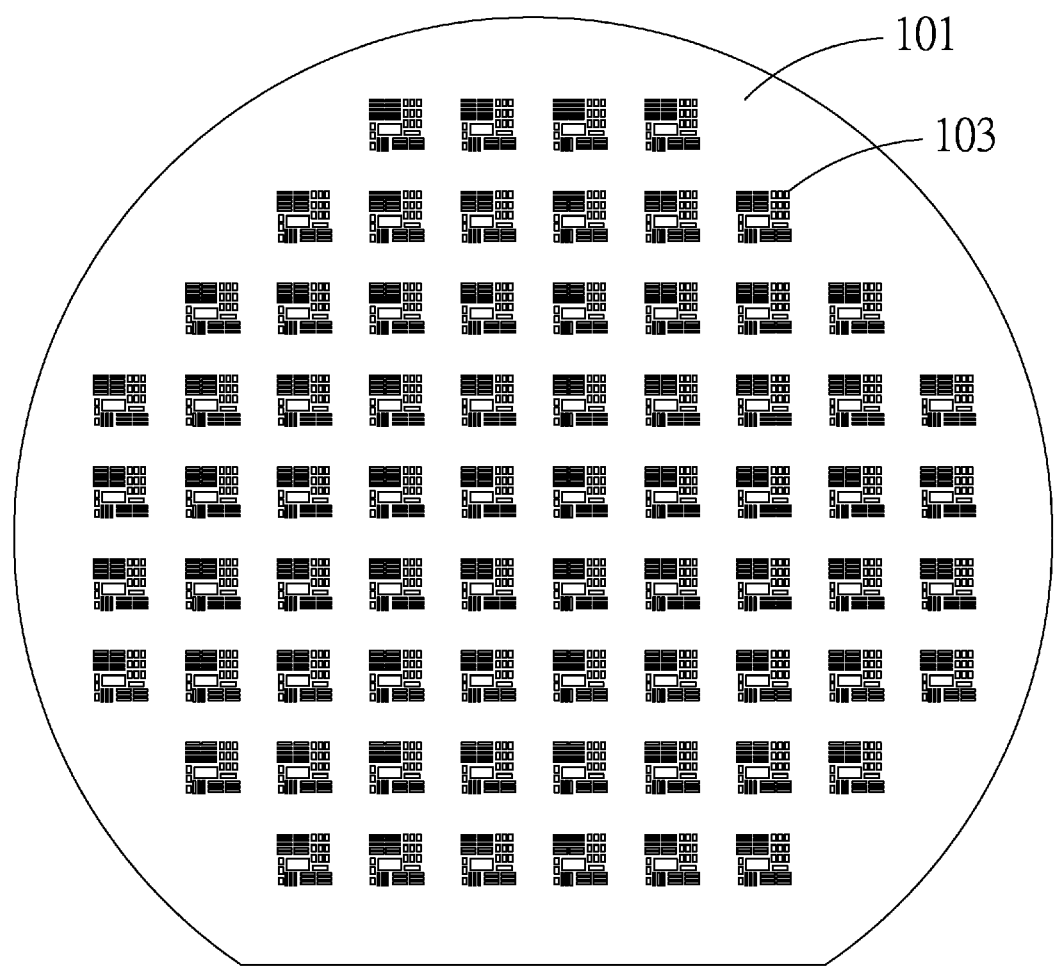
FIG. 1A is a schematic view showing the front and the back views of the substrate of integrated circuit chips.
Figure 1B:
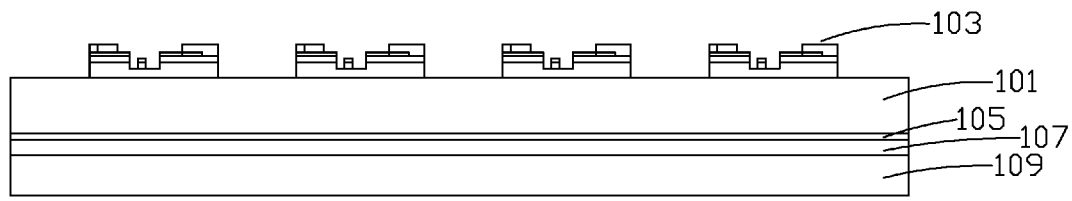
FIG. 1B is a cross-sectional view of the structure of an adhesive seed layer, a backside metal layer, and a photoresist layer formed on the backside of a substrate according to a previous technology.
Figure 1C:
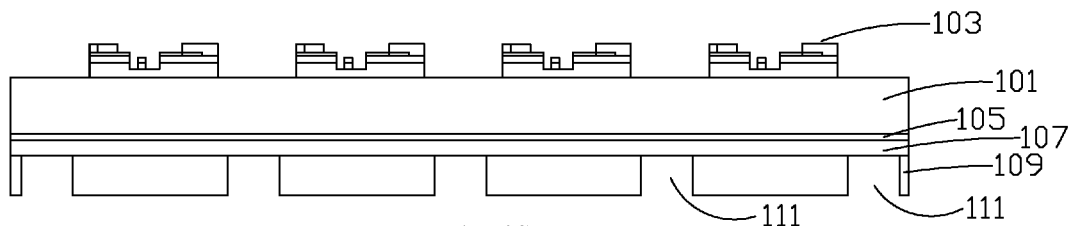
FIG. 1C is a cross-sectional view of the structure of streets formed by etching the photoresist layer on the backside of a substrate according to a previous technology
Figure 1D:
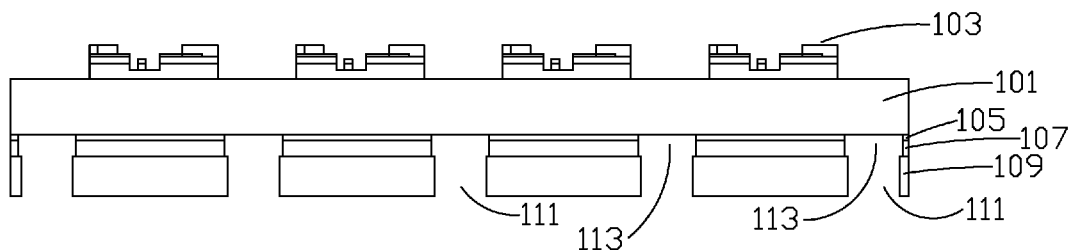
FIG. 1D is a cross-sectional view of the structure of streets formed by etching the backside metal layer on the backside of the substrate according to a previous technology.
Figure 1E:
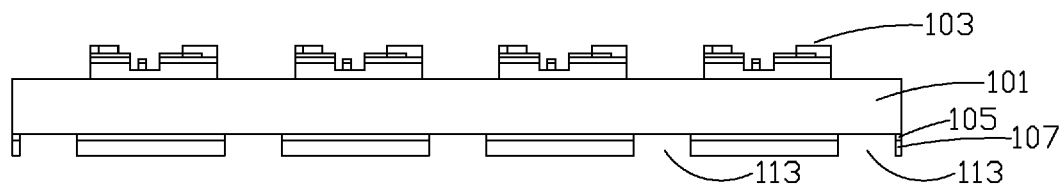
FIG. 1E is a cross-sectional view of the structure after removing the photoresist layer at the backside of the substrate according to a previous technology.
Figure 1F:
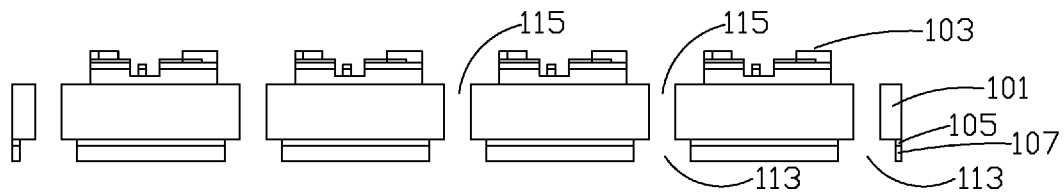
FIG. 1F is a cross-sectional view of the structure of a diced substrate according to a previous technology.
Figure 1G:
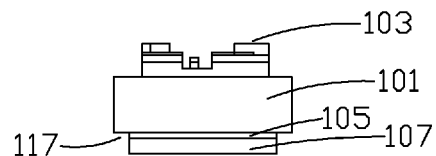
FIG. 1G is a cross-sectional view of the structure of a single chip after substrate dicing according to a previous technology.
Figure 1H:
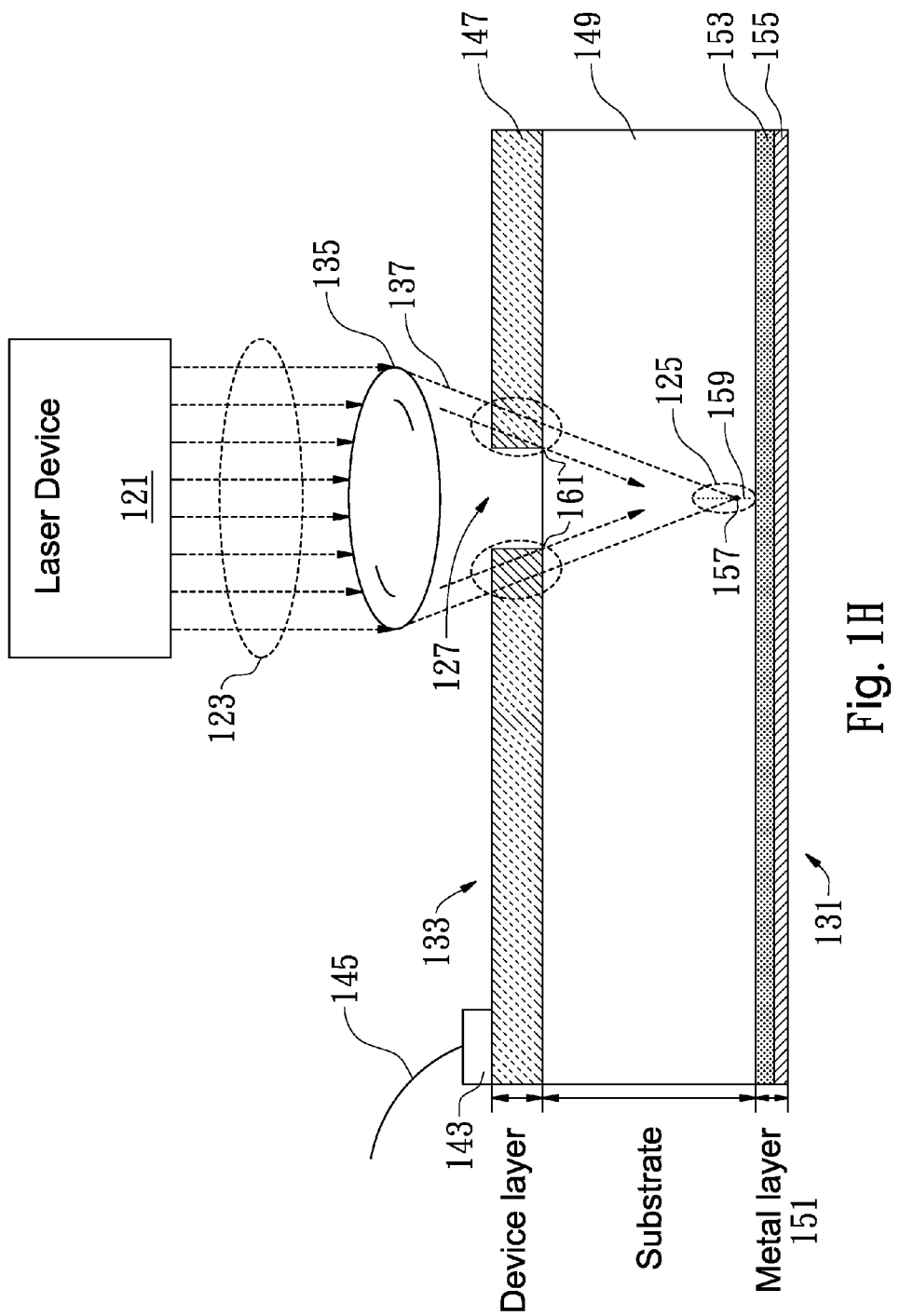
FIG. 1H is a schematic view showing a process of laser scribing in a previous technology.
Figure 2A:
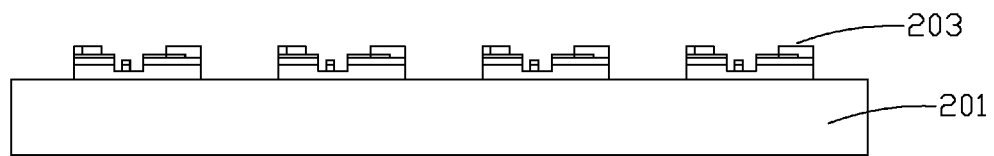
FIG. 2A is a cross-sectional view of the structure of the substrate of integrated circuit chips of the present invention before back thinning.
Figure 2B:
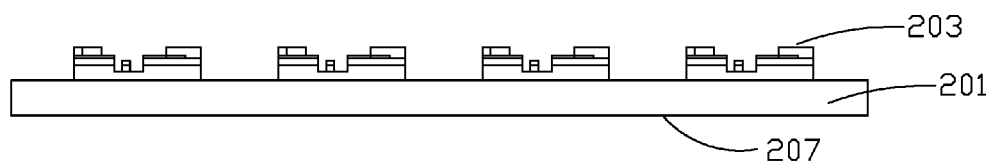
FIG. 2B is a cross-sectional view of the structure of the substrate of integrated circuit chips of the present invention after back thinning.
Figure 2C:
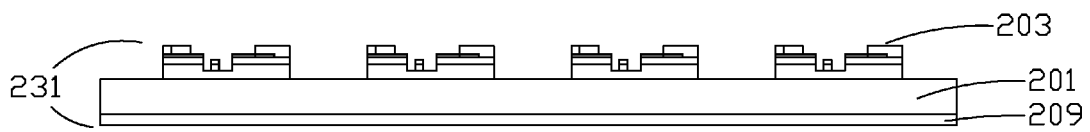
FIG. 2C is a cross-sectional view of the structure of a substrate with the deposited backside metal layer of the present invention.
Figure 2D:
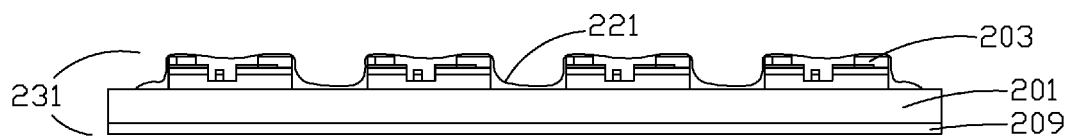
FIG. 2D is a cross-sectional view of the semiconductor wafer with the deposited protection layer of the present invention.
Figure 2E:
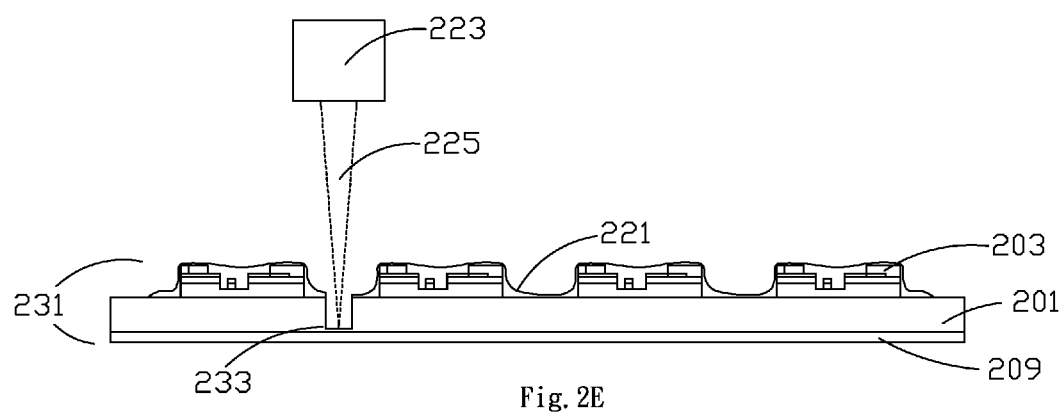
FIG. 2E is a cross-sectional view of the laser dicing the semiconductor wafer of the present invention.
Figure 2F:
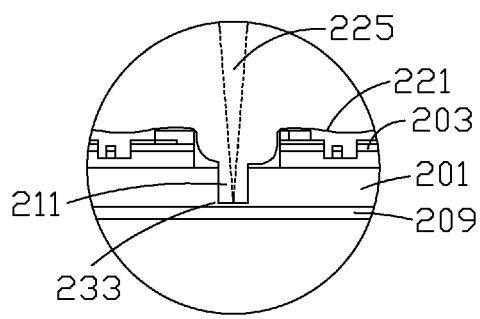
FIG. 2F is a cross-sectional view of the first laser dicing process of the present invention.
Figure 2G:
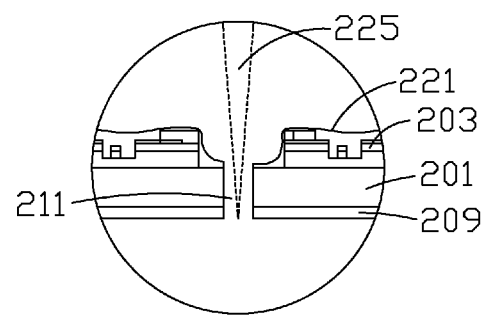
FIG. 2G is a cross-sectional view the second laser dicing process of the present invention.
Figure 2H:
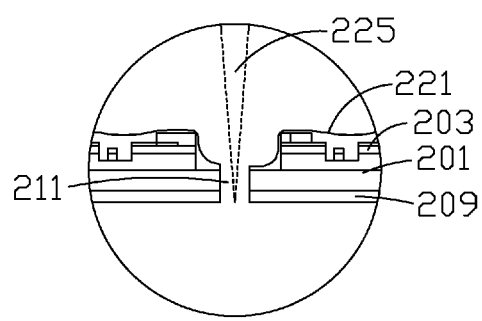
FIG. 2H is a cross-sectional view of one laser dicing process of the present invention.
Figure 2I:
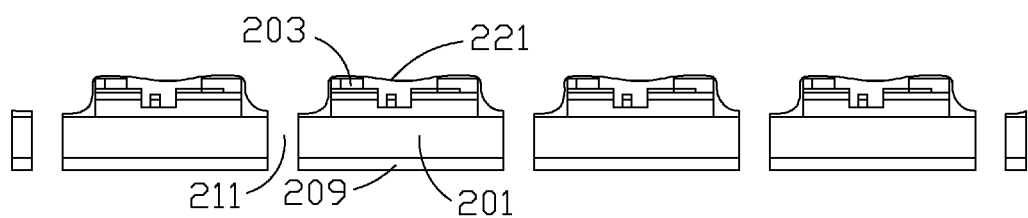
FIG. 2I is a cross-sectional view of semiconductor chips after laser dicing process of the present invention.
Figure 2J:
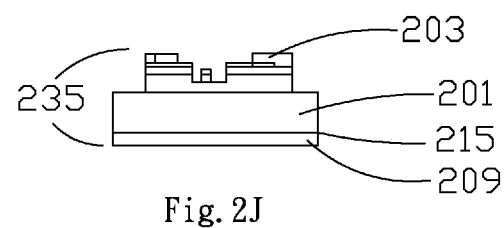
FIG. 2J is a cross-sectional view of the structure of a semiconductor chip with enhanced die strength of the present dicing technique.

The invention claimed is:

1. A fabrication method for producing semiconductor chips with enhanced die strength, comprising following steps:
    Step A1: forming an active layer on a front side of a substrate, in which said active layer comprises at least one integrated circuit;
    Step A2: forming a backside metal layer on a backside of said substrate, in which said backside metal layer at least fully covers the area corresponding to the area covered by said at least one integrated circuit in said active layer, so as to form at least one semiconductor wafer with enhanced die strength by comprising said substrate, said active layer and said backside metal layer;
    Step A3: forming a protection layer on a front side of said semiconductor wafer, in which said protection layer fully covers said at least one integrated circuit in said active layer;
    Step A4: dicing said semiconductor wafer with enhanced die strength from the front side of said semiconductor wafer to a backside of said semiconductor wafer by at least one laser dicing process, whereby plural semiconductor chips with enhanced die strength are produced, wherein said backside metal layer of said semiconductor chip and a substrate of said semiconductor chip are cut tidily, so that the backside metal layer of said semiconductor chip fully covers the backside of said semiconductor chip, and the composition at the border remains intact to prevent die cracking on the border between said substrate of said semiconductor chip and said backside metal layer of said semiconductor chip; and
    Step A5: removing the laser dicing residues and removing said protection layer by at least one etching process, wherein said laser dicing residues are generated during said at least one laser dicing process.

2. The fabrication method according to claim 1, wherein in Step A4 said at least one laser dicing process includes following two laser dicing processes:
    the first laser dicing process: dicing said semiconductor wafer with enhanced die strength by using a laser from the front side of said semiconductor wafer to a sufficient depth of said substrate close to said backside metal layer, so as to accelerate the dicing of said substrate; and
    the second laser dicing process: dicing said semiconductor wafer with enhanced die strength by using a laser from said sufficient depth of said substrate close to said backside metal layer to the backside of said semiconductor wafer, so as to reduce melting fragment of said backside metal layer.

3. The fabrication method according to claim 2, wherein the power of the laser used in said first laser dicing process is larger than 2.7 W and smaller than 4.8 W; the power of the laser used in said second laser dicing process is larger than 3.5 W and smaller than 4.3 W.

4. The fabrication method according to claim 2, wherein said sufficient depth of said substrate close to said backside metal layer is thicker than 50% of said substrate thickness and thinner than 95% of said substrate thickness.

5. The fabrication method according to claim 1, wherein in Step A4 the power of the laser used in said at least one laser dicing process is larger than 2.7 W and smaller than 4.8 W.

6. The fabrication method according to claim 1, wherein in Step A4 the area of the backside metal layer of said semiconductor chip is larger than or equal to the backside area of the substrate of said semiconductor chip.

7. The fabrication method according to claim 1, further comprising an A15 step between the Step A1 and the Step A2:
    Step A15: grinding the backside of said substrate, so as to thin said substrate.

8. The fabrication method according to claim 7, wherein in Step A1 the thickness of said substrate is larger than 10 μm and smaller than 200 μm.

9. The fabrication method according to claim 1, wherein in Step A1 the material used for said substrate is GaAs, InP or Si.

10. The fabrication method according to claim 1, wherein in Step A3 said protection layer is a photoresist.

11. The fabrication method according to claim 1, wherein in Step A3 the thickness of said protection layer is lager than 0.5 μm and smaller than 20 μm.

12. The fabrication method according to claim 1, wherein Step in A5 said at least one etching process includes following two etching processes:
    the first etching process: removing said laser dicing residues; and
    the second etching process: removing said protection layer.

13. The fabrication method according to claim 12, wherein said first etching process uses a water solution of sulfuric acid ($H_2SO_4$) and hydrogen peroxide ($H_2O_2$).

14. The fabrication method according to claim 12, wherein said second etching process uses a water solution containing potassium borate and potassium hydroxide.

15. The fabrication method according to claim 1, wherein in Step A2 the material used for said backside metal layer is metal or alloy.

16. The fabrication method according to claim 15, wherein said metal is gold or copper.

17. The fabrication method according to claim 1, wherein in Step A2 said backside metal layer is deposited to the backside of said substrate by evaporation, electroplating, sputtering or molecular beam epitaxy (MBE).

18. The fabrication method according to claim 1, wherein in Step A2 said backside metal layer fully covers the backside of said substrate.

* * * * *